(12) United States Patent
Palm et al.

(10) Patent No.: US 9,352,431 B2
(45) Date of Patent: May 31, 2016

(54) DEVICE FOR FORMING A REDUCED CHAMBER SPACE, AND METHOD FOR POSITIONING MULTILAYER BODIES

(75) Inventors: Joerg Palm, Munich (DE); Stefan Jost, Munich (DE); Martin Fuerfanger, Steinhoering (DE); Jessica Hartwich, Sauerlach (DE)

(73) Assignee: Saint-Gobain Glass France, Courbevoie (FR)

( * ) Notice: Subject to any disclaimer, the term of this patent is extended or adjusted under 35 U.S.C. 154(b) by 516 days.

(21) Appl. No.: 13/580,322

(22) PCT Filed: Feb. 22, 2011

(86) PCT No.: PCT/EP2011/052597
§ 371 (c)(1),
(2), (4) Date: Dec. 4, 2012

(87) PCT Pub. No.: WO2011/104231
PCT Pub. Date: Sep. 1, 2011

(65) Prior Publication Data
US 2013/0067723 A1    Mar. 21, 2013

(30) Foreign Application Priority Data
Feb. 23, 2010   (EP) .................................. 10154363

(51) Int. Cl.
*B23Q 3/00*   (2006.01)
*C23C 16/458*   (2006.01)
(Continued)

(52) U.S. Cl.
CPC .............. *B23Q 3/00* (2013.01); *C23C 16/4582* (2013.01); *H01L 21/67109* (2013.01);
(Continued)

(58) Field of Classification Search
CPC .. B23Q 3/00; C23C 16/4582; C23C 16/4581; H01L 21/67346; H01L 21/67353; H01L 21/67383; H01L 31/1864; H01L 31/1876; H01L 21/67115; Y02E 10/50; Y10T 29/49998
See application file for complete search history.

(56) References Cited

U.S. PATENT DOCUMENTS 5,192,371 A  *  3/1993  Shuto et al. ................... 118/728
5,353,934 A      10/1994  Yamauchi
(Continued)

FOREIGN PATENT DOCUMENTS

DE    10 2008 008 518    8/2009
EP        1 833 097       9/2007
(Continued)

OTHER PUBLICATIONS

U.S. Appl. No. 13/580,241, filed Aug. 21, 2012, Palm, et al.
(Continued)

*Primary Examiner* — Alexander P Taousakis
(74) *Attorney, Agent, or Firm* — Oblon, McClelland, Maier & Neustadt, L.L.P.

(57) ABSTRACT

A device for forming a reduced chamber space, which is a process box or a process hood, containing an apparatus, which positions at least two multilayer bodies each including a surface to be processed, wherein the apparatus is designed such that the multilayer bodies are opposite to each other, wherein the surfaces to be processed are facing away from each other such that the multilayer bodies can be processed as a multilayer body arrangement in a processing system. In addition, a method for positioning the two multilayer bodies comprising a surface to be processed, with the two multilayer bodies disposed in such a device such that multilayer bodies are opposite each other, wherein the surfaces to be processed are facing away from each other, such that the multilayer bodies are processable as a multilayer body arrangement in a processing system.

6 Claims, 4 Drawing Sheets

(51) Int. Cl.
*H01L 21/67* (2006.01)
*H01L 21/673* (2006.01)
*H01L 31/18* (2006.01)

(52) U.S. Cl.
CPC ... *H01L 21/67346* (2013.01); *H01L 21/67353* (2013.01); *H01L 21/67383* (2013.01); *H01L 31/1876* (2013.01); *Y02E 10/50* (2013.01); *Y02P 70/521* (2015.11); *Y10T 29/49998* (2015.01)

(56) References Cited

U.S. PATENT DOCUMENTS

| | | | |
|---|---|---|---|
| 5,674,786 A * | 10/1997 | Turner et al. | 438/758 |
| 6,273,275 B1 | 8/2001 | Kim et al. | |
| 6,899,507 B2 * | 5/2005 | Yamagishi et al. | 414/217 |
| 7,033,126 B2 * | 4/2006 | Van Den Berg | 414/416.03 |
| 7,181,132 B2 * | 2/2007 | De Ridder | 392/416 |
| 2002/0076882 A1 | 6/2002 | Iwane et al. | |
| 2003/0235652 A1 * | 12/2003 | Wakabayashi et al. | 427/248.1 |
| 2005/0158164 A1 * | 7/2005 | Lee | 414/791.4 |
| 2005/0188923 A1 * | 9/2005 | Cook et al. | 118/728 |
| 2008/0110495 A1 | 5/2008 | Onodera et al. | |
| 2012/0279549 A1 * | 11/2012 | Urien et al. | 136/244 |
| 2013/0029479 A1 * | 1/2013 | Jost et al. | 438/479 |
| 2013/0337655 A1 * | 12/2013 | Lee et al. | 438/715 |
| 2014/0363916 A1 * | 12/2014 | Fuerfanger et al. | 438/57 |

FOREIGN PATENT DOCUMENTS

| | | |
|---|---|---|
| GB | 2 331 509 | 5/1999 |
| JP | 60 021897 | 2/1985 |
| JP | 2008 124091 | 5/2008 |
| WO | 2004 032593 | 4/2004 |

OTHER PUBLICATIONS

U.S. Appl. No. 13/580,383, filed Oct. 19, 2012, Jost, et al.
U.S. Appl. No. 13/581,982, filed Aug. 30, 2012, Hartwich, et al.
International Preliminary Report on Patentability and Written Opinion issued Aug. 28, 2012 in PCT /EP2011/052597 (English translation only).
International Search Report Issued Apr. 14, 2011 in PCT/EP11/52597 Filed Feb. 22, 2011.
U.S. Appl. No. 14/487,805, filed Sep. 16, 2014, Palm, et al.

* cited by examiner

DEVICE FOR FORMING A REDUCED CHAMBER SPACE, AND METHOD FOR POSITIONING MULTILAYER BODIES

The invention relates to a device for forming a reduced chamber space with an apparatus for positioning multilayer bodies, as well as a method for positioning multilayer bodies.

In the following, the processing of multilayer bodies is described, e.g., of substrates (e.g., glass substrates). Even when the specific term "substrates" is used, the statements always refer in general to "multilayer bodies". A "naked", uncoated substrate can be referred to as a substrate as can be a coated substrate, i.e., a multilayer body. A multilayer body is formed, for example, by application of a functional layer on a carrier layer. In order for the layers or at least the functional layer to have the desired physical and/or chemical properties, the multilayer body or, optionally, the layers, must be subjected to processing. The processing can, for example, be provided as tempering or annealing in the presence of a process gas. For this, systems in which a multilayer body can be heated are provided. The multilayer bodies are used in order to produce, for example, (in particular large-area) thin-film semiconductors, for example, thin-film solar cells or modules. Solar power systems are operated, e.g., with solar modules based on chalcopyrite semiconductors (e.g., $CuInSe_2$, abbreviated as "CIS" or $Cu(In,Ga)(S,Se)_2$, abbreviated as "CIGSSE"). Such thin-film solar modules have at least one substrate (e.g., glass, ceramic, metal foil, or plastic film), a first electrode (e.g., molybdenum Mo or a metal nitride), an absorber layer (e.g., $CuInSe_2$ or more generally $(Ag,Cu)(In,Ga,Al)(Se,S)_2$), a front electrode (e.g., ZnO or $SnO_2$), and encapsulation and covering materials (e.g., EVA/glass or PVB/glass, where EVA means ethylene vinyl acetate and PVB means polyvinyl butyral) as basic components. Other layers, such as alkali barrier layers between glass and Mo or buffer layers between an absorber and a window layer, can be used to improve efficiency and/or long-term stability. A substantial further component of a typical thin-film solar module is the integrated series connection that forms a series-connected chain from individual solar cells and thus enables higher operational voltages. In the following, in each case the chemical symbol for specific elements will be indicated, for example, "Mo" for molybdenum or "Se" for selenium. Laboratory experiments show that the currently known production methods can still be greatly improved and that by means of process engineering approaches and optimization, substantial cost savings can be achieved. Currently, there are various methods for production of thin-film solar modules based on chalcopyrite semiconductors. In a known two-step method, the so-called precursor layers Cu(Ga), In, and Se are deposited in a first step onto the cold substrate already provided with a Mo thin-film. This can be done, for example, by sputtering, electrodeposition, screen printing, vaporization processes, or chemical gas phase deposition. In a second step, the substrate coated in this matter is heated in a processing chamber (an appropriate furnace) in the absence of air, by running through a predefined tested temperature profile from room temperature up to ca. 600° C. During this tempering process, the desired chalcopyrite semiconductor is formed from the precursor layers in a complex phase transition. This process can be referred to as in-line processing, e.g., in-line selenization. Sulfurization is also possible in this manner. In-line tempering processes require reliable mastery of rapid CIS layer formation processes, as well as of likewise accelerated heating and cooling processes for large coated glass sheets, for instance. A layer package consisting of, e.g., copper, indium, and gallium, as well as a final covering made of elemental selenium is brought to relatively high temperatures at relatively high heating rates of up to a few K/s, at which the previously applied individual components react to form semiconductor compounds (rapid thermal processing, RTP, of layer stacks—precursor layers, SEL-precursor, stacked elemental layer). These substantially shorter reaction times compared to furnace processes, now enable a transfer to continuous processes. The process chamber has, e.g., a tunnel or forms a tunnel which, for example, can be sealed by airlocks or is provided as a closed process chamber. The process chamber is irradiated for heating by energy sources, i.e., for example, emitters disposed in matrices. The large-area processing of $Cu(In,Ga)(S,Se)_2$ (CIGSSE) chalcopyrite semiconductor on glass substrates, starting from SEL-precursors thus necessitates the following fundamental prerequisites: rapid heating rates in the range of a few K/s, homogeneous temperature distribution over the glass substrate (laterally) and over the substrate thickness, guarantee of adequately high, controllable, and reproducible partial pressure of the chalcogen elements (Se and/or S) during RTP (prevention of Se and/or S losses or other applied elements), controlled process gas feed (e.g., $H_2$, $N_2$, Ar, $H_2S$, $H_2Se$, S gas, Se gas), and maximum temperatures above 500° C. The industrial scale in-line methods are very complex in terms of process and plant engineering. This results in the fact that the investment costs for this process step consume a not insubstantial proportion of the overall investment costs of a solar manufacturing plant.

Consequently, the object of the invention is to design the thermal processing of objects, in particular of multilayer bodies, more efficiently and thus to reduce the investment costs, in particular for corresponding processing systems, thereby also reducing production costs. This object is accomplished by means of a device for forming a reduced chamber space, as well as by a method for positioning multilayer bodies with the characteristics of the independent claims. Advantageous embodiments of the invention are indicated by the characteristics of the subclaims.

In particular, the object is accomplished by means of a device for forming a reduced chamber space, for example, a process box or a process hood, with an apparatus for positioning at least two objects, in particular multilayer bodies each having at least one surface to be processed. The apparatus for positioning at least two objects, in particular at least two multilayer bodies each having at least one surface to be processed, is designed such that the objects, in particular multilayer bodies, are opposite each other and the surfaces to be processed are facing away from each other. Thus, the at least two objects are processable, in particular selenizable, as a multilayer body arrangement in a processing system. The multilayer bodies can have a certain distance between them; optionally, the surfaces to be processed, in particular the bottom one can, however, also rest directly on a suitable location (e.g., chamber floor). An essential point of the invention consists in being able to simultaneously process two multilayer bodies, e.g., glass substrates with precursor coating, (dual substrate back-to-back RTP), since they are appropriately positioned or supported by the apparatus for positioning (also a supporting apparatus). The two substrates are coated with the precursor elements, e.g., Cu, Ga, In, Se, Na, with these coated surfaces to be processed disposed facing away from each other. With retention of the same process time, this results in doubled system throughput with a virtually constant system footprint and comparable system investment volume. In other words, the system design can be substantially retained. The multilayer bodies to be processed already have, as already described above, first coatings (precursor). Additional elements are deposited onto these coatings and/or conversions occur in the coatings to convert the precursor into the desired semiconductor. Consequently, the surfaces to be processed are referred to generally in the following as "coating", as "coated surfaces", as "coated side", or even as "surfaces to be processed", etc. The coated surfaces face in the direction of the energy sources; consequently, higher and, in general, faster and more direct temperature measurement and, thus, temperature control or regulation are possible for the layer. The efficiency levels obtainable with processing can thus be increased; at the same time, the process times can be reduced. The invention refers not only to chalcopyrite semiconductors, but also to all applications of functional thin films on substrates (e.g., CdTe-semiconductors and related semiconductors in addition to the chalcopyrite semiconductors).

The device for forming a reduced chamber space can, in particular, be disposed outside the processing system to accommodate the multilayer bodies in order to ultimately bring them into the chamber or the tunnel. To this end, for example, a transport apparatus is provided to transport them into the system and out of it again. For this, the device is preferably configured such that it is transportable with the transport apparatus on the carrying element (a carrier, a type of transport device, such as a transport plate). The carrier alone can also form the transport device. The device can also be manually introduced into the system or be assembled directly therein.

To consume the least possible process gas, it is expedient to reduce the chamber space and to provide a processing space per se. Consequently, at least partially transparent panes (e.g., made of glass ceramic) or panes highly absorbent for the selected energy source that function as a secondary energy source or as an energy transmitter can be disposed between the substrates and the energy sources, with these panes forming a defined processing space in order to reduce or minimize the vaporization of volatile components during the heating process. In certain phases of the process, additional process gases (e.g., $H_2$, $N_2$, Ar, $H_2S$, $H_2Se$, S gas, Se gas, and/or others) can be introduced into this processing space. This is realized with the device for forming a reduced chamber space that is implemented, for example, as a process box or a process hood. The apparatus for positioning at least two multilayer bodies is designed such that it is disposed in the process box or process hood. In the RTP process, the process gases $H_2$, $N_2$, Ar, $H_2S$, $H_2Se$, S gas, Se gas, for example, can be used and introduced into the furnace interior, i.e., into the chamber space or into the interior of the process box at selected process times. It is thus also possible to perform the sulfurization process with gaseous sulfur (S) or the selenization process with gaseous selenium (Se). An adequate amount of Se is necessary to ensure complete selenization of the metallic (e.g.) CuInGa-precursors. Se loss would result in an incomplete conversion of the precursor into the chalcopyrite semiconductor and thus in a clear loss of power of the solar module. Guaranteeing an adequate amount of Se is accomplished, e.g., through the use of the process box. The same is true for other such processes. Process boxes can be designed either open or closed. With open boxes, no side walls or only partial side walls are present. With closed boxes, a floor element, a cover element, and side walls enclose the processing space substantially completely. Process hoods are customarily positionable on the floor of the process chamber and are provided for stationary retention in the chamber. Preferably, at least a part of the apparatus for positioning forms at least a part of the process box, in particular at least partially forms the side wall elements of the process box. Thus, a process box can be produced in a simple manner. If a process box is provided to reduce the chamber space, the apparatus for positioning can be disposed directly therein. Ultimately, the process box can then be conveyed with the multilayer body arrangement into the processing system (e.g., by means of the carrier). It is also possible to "assemble" the multilayer body arrangement outside the system and only introduce it into the chamber thereafter (e.g., by means of the possible movable carrier or even manually). In other words, the apparatus is disposed on the carrier such that the assembled multilayer body arrangement can be brought into the system by means of the transport apparatus and/or by means of the carrier. The process chamber of the system could then have, for example, the above-described process hood such that it is possible to operate with a reduced chamber space.

The device for forming a reduced chamber space and/or the apparatus for positioning (which may form part of the device) are preferably configured such that the (reduced) space formed by the floor element and bottom substrate or cover element and top substrate has a suitable volume: it must not be too large, so not too large an amount of chalcogens (Se or S) or possibly even volatile reaction products vaporize (to be estimated based on the equilibrium vapor pressure at process temperature), but also not too small, so, in the event of temporary deflections of the substrate during the heating process, the coated sides of the substrate do not touch the opposing counter plate (in particular not in the case of the top pane). The distance between the counter plate and substrate should, for example, in each case, be roughly between 1 and 20 mm. However, in principle, even direct contact between the substrate and the counter plate would be possible.

In order for the radiation from the energy sources to be able to penetrate all the way to the surfaces to be processed, (as already indicated above) the intervening elements, such as floor element and cover element of the process box or even the process hood are implemented at least partially transparent, depending on the design of the energy sources. Between the substrate and the radiation sources, any elements must thus be implemented (to the extent the energy source arrangement necessitates this) as partially transparent or transparent panes (made, for example, of glass ceramic) or as panes highly absorbent for the selected energy source, which function as secondary energy sources or energy transmitters. If the sources are disposed, for example, in the interior of the process chamber (possibly even in the interior of the process box or hood), and if the multilayer body arrangement is also located, for example, inside the process chamber, the chamber walls (side walls, cover, and/or floor) can also be non-transparent. For example, glass ceramic, other ceramics, graphite, metals, and refractory glasses (selection) can be provided as materials for the floor and cover element or the process hood. Silicon carbide can also be provided for this. The carrier should also be implemented at least partially from partially transparent or highly absorbent material since it can remain in the system during processing.

In an advantageous embodiment, the apparatus is configured such that the multilayer bodies are disposed sandwich-like on top of each other while in use and thus form a bottom multilayer body and a top multilayer body of the multilayer body arrangement. Thus, the coating or the surface to be processed is disposed on the top of the top substrate and on the bottom of the bottom substrate (back-to-back arrangement). In this case, the substrates can be stacked or positioned or disposed in a simple manner in the chamber or the device for forming a reduced chamber space, namely lying on each other with the surfaces to be processed facing away from each other. In other words, the back sides of the substrates are lying on each other.

Preferably, the apparatus has at least one spacing element, with the spacing element disposed at least partially between the two multilayer bodies such that they can be positioned or disposed with a distance between them. A spacing element facilitates the subsequent lifting of the top substrate off the bottom one (e.g., adhesion).

In an advantageous embodiment of the invention, the apparatus for positioning at least two multilayer bodies has at least a first supporting element that can be or is disposed, in particular, on the floor element and/or against the side wall elements of a process box. The first supporting element is configured such that the bottom multilayer body can preferably be disposed on its edge regions at lease partially on the first supporting element, in particular can rest on the supporting element.

Advantageously, the apparatus according to the invention has at least a second supporting element that, in particular, can be or is disposed on the floor element and/or against the side wall elements of a process box. The second supporting element is configured such that the top multilayer bodies can be disposed, preferably on its edge regions at least partially on the second supporting element, in particular can rest on the supporting element. The two multilayer bodies can thus be positioned substantially separated from each other. In the case of completely separated positioning, the individual multilayer bodies can be positioned independent of each other (subsequent removal of the processed substrates is thus facilitated). In particular, the first or bottom supporting element can itself also assume the function of the carrier and be conveyed, for example, with a roller drive.

Provision is made in an advantageous embodiment of the invention that the first supporting element and/or the second supporting element are provided, in each case, as a frame element, preferably as a rectangular or square frame element replicating the contours of the multilayer bodies such that the multilayer bodies can be disposed preferably on their edge regions at least partially on the respective frame element, in particular can rest on the frame element. The frame elements enable the least possible contact of the multilayer bodies, i.e., for example, of the substrates, with this (i.e., with the frame element) to keep the surfaces to be processed as free as possible.

Preferably, the first supporting element and/or the second supporting element are each configured as two frame strip elements opposite each other in a plane of extension of the multilayer bodies, such that the multilayer bodies, preferably on their edge regions, e.g., on their longitudinal sides can be disposed at least partially on the frame strip elements, in particular can rest on the frame strip elements. The strips are adequate for positioning; at the same time the surfaces to be processed are even less affected by any support regions. The multilayer bodies can, of course, also be positioned via their transverse sides.

The supporting element (in particular, the bottom one) is preferably configured (e.g., open on the side) such that during the process a process gas, e.g. from an external gas source, can still be introduced from the side. In this case, the distance between the substrate and the counter plate must also be large enough to enable the distribution of process gases (e.g., $H_2$, $N_2$, Ar, $H_2S$, $H_2Se$, S gas, Se gas). Optionally, at least one gas feed element and/or gas evacuation element per se, which is disposed, for example, in the frame element, is provided to feed and/or evacuate the process gas into and/or out of the processing space. The frame element could also have openings to enable process gas circulation. In principle, the gas diffuser can also be otherwise disposed on the chamber and/or the process box. It is important to enable a substantially homogeneous introduction of the process gas from a gas source, e.g., an external gas source, all the way to the substrates (via the process chamber or the process tunnel, or if there is no process chamber or process tunnel, only into a possibly present process box or hood) such that there is the most laminar gas flow possible over the substrate surface from, for example, one longitudinal edge to the other. The gas feed can be controlled at predefined inlets of the gas diffuser at any times during the tempering profile. Consumed quantities of the process gas can thus be reloaded and/or no longer desired excess (for example) selenium vapor (and/or other components of the vapor) can be forced out of the reaction chamber at the right time. It is also possible to configure the frame strip elements such that they extend, in each case, around at least two diagonally opposite corners of the multilayer body arrangement. The remaining open regions that are provided both on the longitudinal sides and on the transverse sides of the arrangement serve for gas exchange.

Another embodiment provides that the apparatus for positioning includes an intermediate element that can be disposed between the first supporting element and the second supporting element such that the second supporting element can be positioned on the first supporting element via the intermediate element. With the modular design, different distances between the two multilayer bodies can be provided and the process gas feed can optionally be controlled accordingly.

An advantageous embodiment provides that the first supporting element and the second supporting element have in each case at least one support region on which the multilayer body (bodies) can be disposed, in particular on which the multilayer body (bodies) can rest. The support regions per se are preferably designed such that the surfaces to be processed are compromised as little as possible by the layering. With the frame elements, the entire strip can be provided for support or even only a subregion. During layering of the substrate, care must be taken that the coated sides be touched as little as possible to prevent contamination by touching or disruption of the process gas atmosphere on the contact surface (so layer quality of the absorber produced is not locally or totally compromised). This requirement is partially facilitated in that, for example, 15 mm of the edge region of each edge is removed anyway in a later process step and, consequently, is not part of the active layer. During the RTP processing, substrate deformation must be contended with, if necessary, since the substrates are more or less floatingly mounted (depending on the supporting element). It is conceivable that, at high process temperatures, sags might occur that are manifested after processing in substrate deformations. Consequently, the first supporting element and/or the second supporting element can have, in each case, at least one cross-connection element to connect regions of the respective frame element opposite each other in the plane of extension of the multilayer bodies or of frame strip elements opposite each other while in use such that the multilayer body (bodies) can be additionally supported to prevent bending. The cross braces also serve to stabilize the frame or the frame elements or the frame strip elements. In the design of the cross braces or cross-connection elements, a minimal width must be ensured in order to minimize shadowing of the radiation of the (heat) emitters or the energy sources. Since the cross-connection element can be pulled substantially "crosswise" over the surface to be processed, the contact between the cross connection element and the surface must be kept as little as possible. To this end, the cross-connection element can have at least a first support element such that the multilayer bodies can abut against or rest on the cross connection element via the support element, with the support element configured such that it has the same height as the respective at least one frame element or the frame strip elements (flat resting of the substrates on the frame element(s) and the support element). Preferably, at least a second support element (of the apparatus for positioning) is provided on the chamber floor of the process chamber and/or on the floor element of the process box to support the multilayer body arrangement. In particular, the arrangement on the "bottom" region of the multilayer body arrangement is expedient, since the greatest load possibly lies there (depending on the design of the apparatus for positioning).

Preferably, the first and/or second support element is (or the support elements are) configured as a point support element, preferably as a spherical element. Thus, the smallest possible support area or even system footprint is guaranteed. Even less shadowing is achieved by means of needle-shaped supports. In a preferred embodiment of the invention, the respective frame element and/or frame strip element has at least two support elements such that the multilayer bodies can rest on or abut against the support element(s). In other words, the support region can be reduced even on the frame element if this is configured with the support elements. Preferably, the first and/or the second supporting element is made of graphite or quartz glass; glass ceramic, other ceramics, and refractory glasses are also conceivable. The frame material should be inert, resistant in a corrosive environment (containing S, Se), and mechanically stable. Due to the direct contact with the substrates, the thermal conductivity and the coefficient of thermal expansion must also be considered in order to avoid lateral inhomogeneities of temperature distribution on the substrate as much as possible and to prevent layer delamination or damage. Frame material and also support elements can be made of graphite or quartz glass, glass ceramic, other ceramics, or refractory glasses (e.g., graphite spheres). In the selection of materials for the point supports, the following material properties must also be taken into account: inert material, corrosion resistance, mechanical stability, thermal conductivity, and coefficient of thermal expansion. The use of graphite spheres, for example, in combination with a graphite frame element is, for example, conceivable.

Independent protection is also claimed for a system for processing, in particular, for selenizing, at least two objects, in particular at least two multilayer bodies, each having at least one surface to be processed, comprising at least one process chamber with a chamber space (even a tunnel is possible), and at least one device for forming a reduced chamber space which has an apparatus for positioning at least two multilayer bodies, as is described above. Preferably, the system has at least one energy source for heating the multilayer bodies. Preferably, the energy source is disposed on the process chamber or in the processing system such that each of the surfaces to be processed is heated directly. For this, for example, two energy sources can be provided: one for the bottom multilayer body, one for the top multilayer body (in other words, in each case, at least one energy source is provided for each of the multilayer bodies). Preferably, however, a plurality of energy sources are provided for each substrate, which are disposed, for example, as a matrix in each case. The arrangement is variable. In this arrangement, the rapid heating of the substrates thus occurs substantially only one-sidedly by means of the heating of the respective layer side: The top substrate is heated only from above; the bottom one is heated only from below. Direct heating of the back sides of the glass does not occur. Consequently, at high heating rates care must be taken that temporary pane deflections do not occur due to different thermal expansions of the top and bottom sides of the glass. After reaching the maximum temperature, the vertical gradients and with them the deflection must however be compensated anyway. Since the thickness of the glass is only 2 to 3 mm, it is not to be anticipated that with heating rates in the range of a few K/sec, vertical gradients strong enough to result in breakage of the pane would be produced. Also important for low breakage rates is the lateral homogeneity (in the substrate surface). Experience has shown that it is also very important to optimize lateral homogeneity during cooling. With the cooling rates obtainable in this arrangement, it is not to be anticipated that stresses can develop in the glass due to vertical gradients between the layer side and the back side. The direct heating of the layer yields very good heating rates. High heating rates are advantageous in certain phases of the CIS layer formation from metals and selenium.

According to the invention, at least one device for forming a reduced chamber space, preferably a process box or a process hood, is disposed in the process chamber. Devices of this type reduce the actual space that is available for processing and form a processing space per se (cf. above). Advantageously, the process box has at least one cover element and at least one floor element, between which the at least two multilayer bodies can be or are disposed, whereby the process box can be introduced into the process chamber (along with the multilayer body arrangement) and removed therefrom. In this case, the multilayer body can be placed on the floor element. The process box is closed by means of the cover element. Thus, the multilayer body arrangement is accommodated in a defined manner inside the process space of the system. The process hood is, as a rule, designed for stationary retention in the processing system and is placed, for example, above the multilayer body arrangement introduced by the transport apparatus. Thus, the process hood provides a defined processing space and the gas exchange between the processing space at the chamber space is consequently clearly reduced. As already described above, the process box can also be formed at least partially by the apparatus for positioning the objects. Preferably, the system has a gas feed element and/or a gas evacuation element to feed and/or evacuate the process gas into and/or out of the chamber space and/or the processing space. As already described above, this can, for example, be provided on the first and/or second supporting element, depending on the design of the apparatus for positioning.

The invention further extends to a method for positioning at least two multilayer bodies each having at least one surface to be processed, wherein the two multilayer bodies are disposed in a device for forming a reduced chamber space, for example, a process box or a process hood, such that the multilayer bodies are opposite each other, wherein the surfaces to be processed are facing away from each other such that the at least two objects are processable in a processing system as a multilayer body arrangement.

The invention further relates to a method for positioning at least two objects, in particular at least two multilayer bodies each having at least one surface to be processed accomplished by means of an apparatus for positioning the at least two objects, in particular multilayer bodies, that is designed to accommodate the at least two objects, in particular the multilayer bodies, wherein the method comprises the following steps: Arranging the apparatus at a location provided therefor; arranging the two objects, in particular multilayer bodies, on the apparatus such that the objects, in particular multilayer bodies, are opposite each other, with the surfaces to be processed facing away from each other such that the at least two objects are processable, in particular selenizable, in a processing system as a multilayer body arrangement. Preferably, the additional step is provided: Arranging the apparatus in a process chamber or a process tunnel of the processing system with a chamber space and/or in a device for forming a reduced chamber space and/or on or against a carrying element for transportation of the multilayer body arrangement by means of the transport apparatus into the processing system (i.e., into the process chamber or into the process tunnel) and out of it or to an another location provided therefor. In an advantageous embodiment of the method, the step of arranging the apparatus can be provided as follows: Arranging in a process box with a floor element, a cover element, and, preferably, with side wall elements as the device for forming a reduced chamber space or arranging inside or under a processing hood that is configured, in particular, for stationary retention in the processing system, as the device for forming a reduced chamber space.

As already described above, the multilayer body arrangement can be assembled outside the processing system, e.g., in the process box, which is, for example, transported with the carrying element or directly on the carrying element. The arrangement can then be transported into the processing system by means of the carrying element. It is also possible to transport the arrangement without a carrying element, e.g., with a roller drive. Even manual introduction of the arrangement (both the individual components and also the entire previously assembled arrangement) into the processing system is possible. Moreover, the bottom supporting element can serve as a carrying element and/or transport element.

Preferably, the method comprises the step of arranging the two multilayer bodies on the apparatus sandwich-like on top of each other while in use such that a bottom multilayer body and a top multilayer body are formed. The bodies lying "horizontally" while in use can thus be most uniformly and most reliably processed. Since the two surfaces to be processed are facing away from each other, the substrates can, in the simplest case, be placed (back-to-back) on top of each other for processing. In other words, the method preferably comprises the further step of arranging the two multilayer bodies while in use on the apparatus such that the multilayer bodies are positioned on top of each other with the surfaces to be processed facing away from each other. Preferably, the further step is provided of arranging a spacing element which is included in the apparatus for positioning and, in fact, at least partially between the two multilayer bodies such that they are positioned with a distance between them. In this manner, "sticking together" of the substrates (e.g., due to adhesion) is avoided. In a further advantageous implementation of the method, the following additional steps are provided: Arranging at least one first supporting element which is included in the apparatus for positioning, i.e., that is part of the apparatus, on a chamber floor and/or on chamber side walls of the process chamber and/or on the floor element and/or on the side wall elements of the process box and/or on the carrying element for transport of the multilayer body arrangement by means of the transport apparatus into the processing system and out of it, or at another location provided or suitable therefor; arranging, in particular, resting the bottom multilayer body preferably on its edge regions at least partially against or on the first supporting element.

The following further steps can also be provided: Arranging at least one second supporting element, which is included in the apparatus for positioning, on the chamber floor and/or against the chamber side walls of the process chamber and/or on the floor element and/or against the side wall elements of the process box and/or on or against the first supporting element and/or on or against the carrying element for transport of the multilayer body arrangement by means of the transport apparatus into the processing system and out of it (e.g., carrier), or at another location provided therefor; arranging, in particular, resting the top multilayer body preferably on its edge regions at least partially against or on the second supporting element. Provision is further made to introduce the positioned multilayer bodies into the processing system, to process them, and to remove them again from the system. This is, for example, possible by means of the already described transport apparatus or even manually.

During loading, the bottom substrate is positioned, for example, on a suitable location, e.g., on the bottom or first supporting element on the floor element of a process box (or even without a bottom supporting element). Then, the top substrate is placed on the bottom one or positioned by means of the second supporting element. Finally, the cover element is put on and the entire box is moved into the processing system. In the case of a hood, the carrier is optionally moved into the process chamber and the hood (with cover and frame) is set on the carrier with the multilayer body arrangement. The arrangement can be introduced manually, i.e., by hand, for example, into the processing system or is assembled therein.

The invention also relates to a method for positioning at least two objects, in particular at least two multilayer bodies each having at least one surface to be processed, wherein the method includes the following step: Arranging the two objects, in particular the two multilayer bodies such that the objects, in particular the multilayer bodies, are opposite each other, wherein the surfaces to be processed are facing away from each other such that the at least two objects are processable, in particular selenizable, in a processing system as a multilayer body arrangement. Specifically, this means, for example, arranging the bottom multilayer body in the process chamber, in the process box, on the carrier, or at another suitable location and placing the top multilayer body on the bottom one such that the surfaces to be processed are facing away from each other. This can be referred to as a processing space even though at least one of the surfaces to be processed rests directly on a corresponding suitable location (e.g., chamber floor).

With the method steps just described for assembly of the multilayer body arrangement, the multilayer bodies or substrates can be precisely positioned such that their processing can be performed in a corresponding system with high throughput and in an efficient manner. For the rest and for further details, reference is also made with regard to the method to the statements about the corresponding apparatus for positioning the objects.

The invention further extends to the use of such apparatuses and such a method for deposition of a layer consisting of at least two components on an object for production of a thin-film solar cell or thin-film solar module, which preferably includes as a semiconductor layer a chalcopyrite compound, in particular $Cu(In,Ga)(S,Se)_2$. Preferably, the use serves to produce a CIS or (CIGSSe) thin-film solar cell or a CIS or (CIGSSe) thin-film solar module, wherein, in particular, each multilayer body is implemented in the form of a glass pane and is coated with at least the elements Cu, In or Cu, In, Ga or Cu, In, Ga, selenium for the selenization and/or sulfurization of a chalcopyrite thin-film semiconductor.

It is understood that the various embodiments of the objects of the invention can be realized individually or in any combinations. In particular, the above mentioned characteristics and those to be explained in the following can be used not only in the combinations indicated but also in other combinations or alone, without departing from the framework of the present invention.

In the following, the invention is described with reference to exemplary embodiments that are explained in detail with reference to the drawings. They depict.

In the following description, the same reference characters are used for identical and identically functioning parts. It should be noted that the embodiments depicted in the drawings show cross-sections through the corresponding arrangements, but for the sake of clarity, cross-sectional hatching has been omitted.

Figure 1:
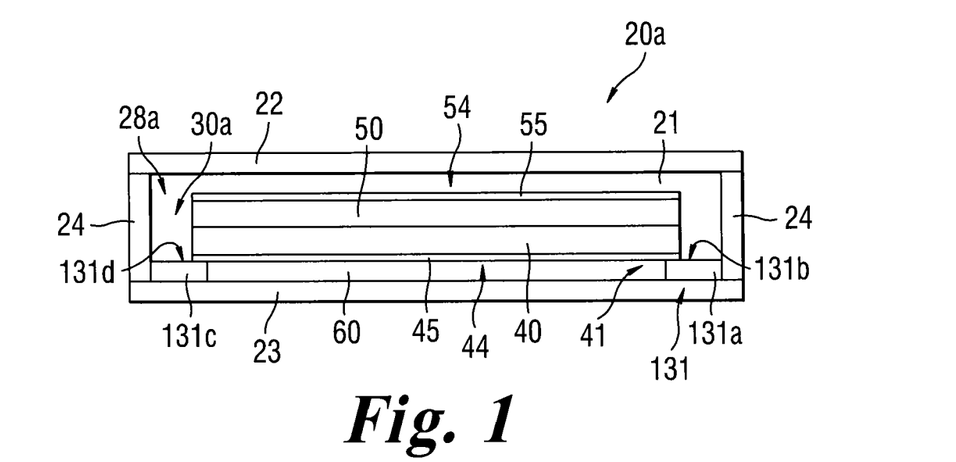
FIG. 1 an embodiment of the device according to the invention for forming a reduced chamber space.

FIG. 1 depicts an arrangement of two objects as can be produced with an apparatus according to the invention. The objects are implemented as multilayer bodies, here as substrates 40, 50 that are provided for processing, in particular, for selenizing. The substrates have, on a surface 44, 54, a coating (precursor) 45, 55 (surfaces to be processed). The coating (a layer package consisting of, e.g., copper, indium, and gallium as well as a final covering made of elemental selenium, precursor) is to be brought to relatively high temperatures in a processing chamber of a processing system (cf. FIG. 8) with relatively high heating rates of up to a few K/s such that the previously applied individual components react to form the semiconductor compound (rapid thermal processing, RTP, of layer stacks—precursor layers, SEL-precursor, stacked elemental layer). Thin-film semiconductors can be produced in this manner, for example, thin-film solar cells or thin-film solar modules. Solar power systems are operated, for example, with solar modules based on chalcopyrite semiconductors (e.g., $CuInSe_2$, abbreviated as "CIS" or $Cu(In,Ga)(S,Se)_2$, abbreviated as "CIGSSE").

Figure 8:
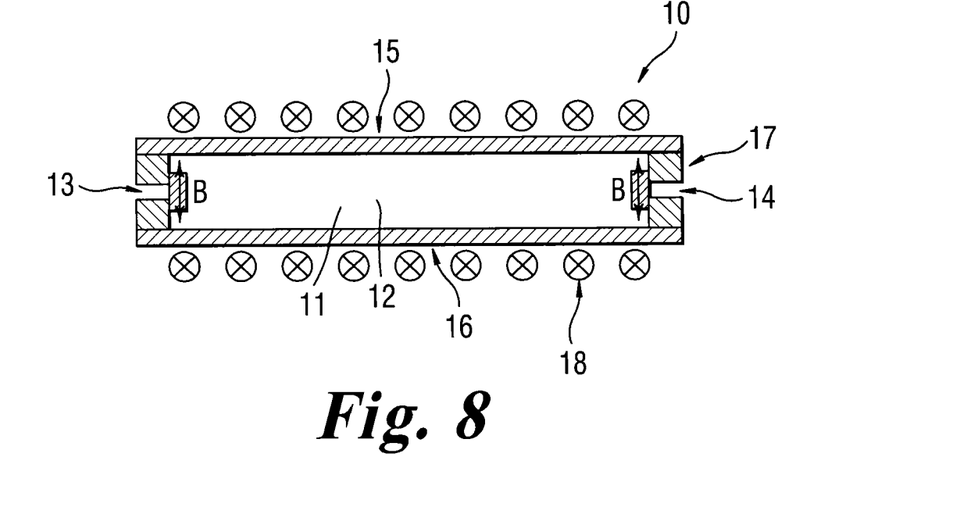
FIG. 8 a system for processing in a cross-sectional view.

FIG. 8 depicts a processing system in cross-section, as is provided for the processing of the multilayer bodies. The system 10 is designed to process large-area substrates. To be discerned is that the system has a process chamber 11 with a chamber cover 15, a chamber floor 16, chamber walls 17 (and, consequently, with a chamber space 12), an entry door 13, and an exit door 14 opposite the entry door. The process chamber 11 or treatment chamber has, in this case, e.g., a tunnel or forms a tunnel, which can, for example, be sealed with the doors (airlocks). The arrows B indicate the direction of movement of the entry door or the exit door. For the transport of the at least two multilayer bodies or of the multilayer body arrangement (not shown), a transport device (not shown) that can transport the substrate through the doors or airlocks 13, 14 through the process chamber 11 can, for example, be provided. Above and below the process chamber 11, a plurality of point sources 18 for electromagnetic radiation are arranged, for example, as a matrix. A different type of sources and/or a different arrangement of these sources is also possible. For passage of the radiation, at least the chamber cover 15 and the chamber floor 16 of the process chamber 11 are configured at least partially transparent at least in regions to enable homogeneous energy action on the substrates. The energy sources can also be disposed inside the chamber 11; then, the walls of the process chamber can also be nontransparent. It is also possible to dispose the energy sources in the corresponding walls or wall sections of the chamber and/or the walls such that they serve under the effect of energy sources as secondary emitters. The processing can occur with an introduced process gas. Suitable gases for this are, e.g., $H_2$, $N_2$, Ar, $H_2S$, $H_2Se$, S gas, Se gas, and/or other gases. In principle, processing without any gas exchange (e.g., between the process chamber and the process box or between a gas source and the process chamber or process box or process hood) is conceivable. Fluid exchange, in particular, gas exchange between the levels of the processing system is possible in various ways. Thus, for example, the exchange of gas can occur between a (e.g., external) gas source, the process chamber (or the process tunnel), and, optionally, the process box or hood. The gas exchange can also occur between an external gas source and an optionally present process box or hood in the absence of a process chamber, i.e., the process box is connected directly to the gas source.

Back to the apparatus or arrangement according to the invention. The multilayer bodies 40, 50 are disposed such that the surfaces to be processed 44, 54 are facing away from each other (dual substrate back-to-back RTP). The substrates 40, 50 are positioned horizontally while in use and are disposed sandwich-like on top of each other. It is thus possible to refer to a bottom multilayer body 40 or a bottom substrate and a top multilayer body 50 or a top substrate. Their positioning possibilities are described in detail in the following. In the above-described system 10, it is often desirable to reduce the chamber space 12 of the process chamber 11 in order to be able to better control the process gas feed or also the process gas evacuation and also the process gas amount. In a defined space, the processing, i.e., the conversion of the coated substrate surfaces, for example, can be more readily calculated and replicated. In this respect, the defined processing space is expedient. For this, for example, in chamber spaces of a process chamber a device for forming a reduced chamber space (and thus for the forming of the already described processing space) can be or is disposed. Such devices are provided, for example, as so-called process boxes, inside the process chambers in which the substrates to be processed are accommodated. Also known are process hoods that are placed above the substrates to be processed (lowered onto the substrates) and rest, for example, on the bottom substrate, on the chamber floor, or on a support per se. The substrates 40, 50 stacked on each other are accommodated here in a process box 20a that can be introduced by means of the transport apparatus into the above-described processing system and again removed from the system after processing (manual introduction and removal are also possible). The process box has a cover element 22, a floor element 23, and side wall elements 24. The front side wall is not seen. Because of their arrangement, the two substrates 40, 50 are processed, i.e., selenized, for example, simultaneously, such that throughput through the system significantly increases (as depicted, for example, by FIG. 8). The defined space in the process box 20a, the so-called processing space 21, can be selectively filled with a specific amount of a process gas for the performance of the processing. In other words, the processing ultimately substantially takes place inside the processing space 21. In principle, it is possible to use the terms a "top" and a "bottom" processing space, i.e., a space between the cover element and the top substrate and the floor element and the bottom substrate. In this embodiment, the substrates 40, 50 are placed directly on top of each other and positioned on an apparatus 30*a* for positioning of the substrates 40, 50 such that the surfaces to be processed are facing away from each other. The precursor layer 55 of the top substrate 50 faces "upward"; the precursor layer 45 of the bottom substrate 40 faces "downward". This arrangement is positioned or supported on a first supporting element 131 of the apparatus 30*a*. The supporting element 131 comprises two frame strip elements 131*a* and 131*c* each having a support surface or a support region 131*b* or 131*d*, with strips disposed on the floor element 23 of the process box 20*a* (fixedly connected to the floor element or simply resting there). The bottom multilayer body 40 is positioned on the strip elements with edge regions 41 and, in turn, supports the top multilayer body 50. Thus, a multilayer body arrangement 28*a* is formed. In order for the surfaces to be processed 44, 45 to come into adequate contact with the process gas, the supporting element 131 must be at least partially open. Thus, here, for example, the bottom substrate rests only on it longitudinal sides on the strip elements 131*a*, 131*c*, whereas gas circulation can occur via the transverse sides. In other words, the arrangement 28*a* has, in each case, an opening area on the transverse sides of the substrates or the arrangement. Here the opening area 60 can be seen. It is, of course, possible to provide the opening area(s) on the longitudinal sides. For a gas flow to be able to be drawn over the surfaces to be processed, the opening area 60 preferably lies opposite a second opening area (in this case primarily for the bottom substrate). The multilayer body arrangement 28*a* could likewise be assembled on a carrier and introduced into the process chamber or into a process tunnel of the processing system (in which, for example, a process hood that can be lowered onto the multilayer body arrangement is situated). Even without a device per se for forming a reduced chamber space, the processing can be performed.

Figure 2:
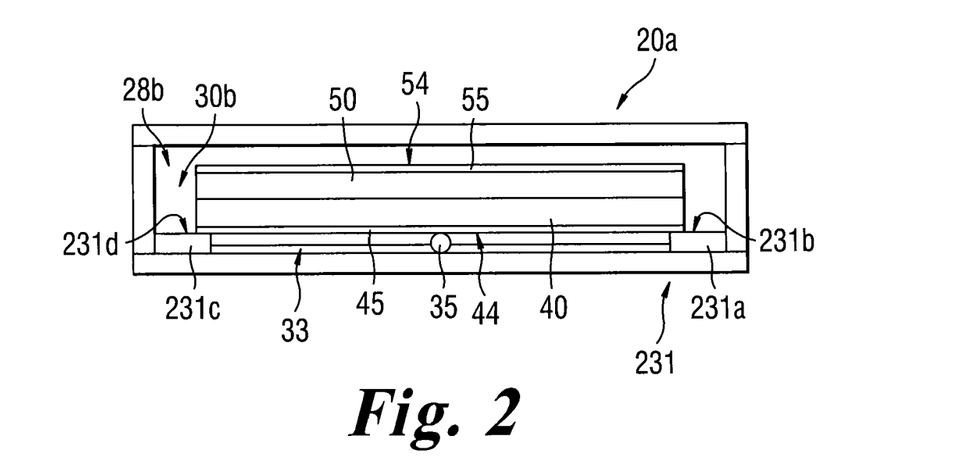
FIG. 2 another embodiment of the device according to the invention for forming a reduced chamber space.

FIG. 2 depicts an embodiment similar to that depicted in FIG. 1; however, a supporting element 231 of an apparatus 30*b* for positioning has a cross-connection element 33 to connect frame strip elements 231*a*, 231*c* opposite each other such that the multilayer body (bodies) 40, 50 can be additionally supported to prevent bending. The multilayer body arrangement 28*b* is thus more stably designed. However, in order not to excessively cover the surfaces to be processed 44, 54, the cross-connection element 33 has at least one (first) support element 35, on which or against which the substrate or the substrates can rest or abut. In this case, the support element 35 is configured such that it has the same height as the strips 231*a*, 231*c*. Only in this manner is a flat support surface for the substrates 40, 50 guaranteed. Both the frame strips 231*a*, 231*c* and the cross-connection element 33 can have one or even a plurality of support elements. This reduces the support regions such that the substrates lie as freely as possible on the surfaces to be processed 44, 54. The number of cross-connection elements and of support elements can be freely selected and is variable as necessary. The arrangement of the support elements is also variable, in other words, the support elements can be disposed on the frame elements and/or on the cross connection elements. The support element(s) 35 is/are preferably configured as point support element(s), i.e., spherical. With the spherical elements only small support regions are provided. Even less shadowing of the radiation of the emitters 18 is achieved by means of needle-shaped elements (cf. e.g., FIG. 3).

Figure 3:
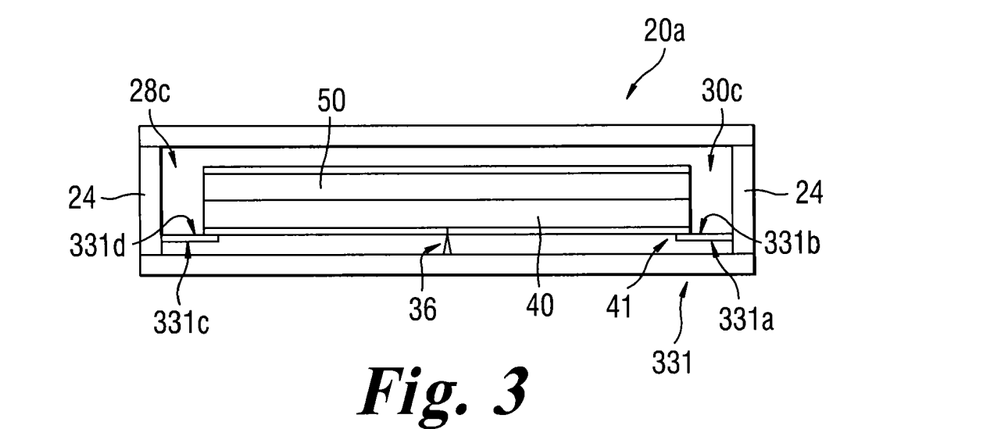
FIG. 3 another embodiment of the device according to the invention for forming a reduced chamber space.

FIG. 3 depicts a multilayer body arrangement 28*c* with an apparatus 30*c* for positioning the substrates 40, 50, wherein the arrangement is likewise accommodated in a process box 20*a*. The substrates 40, 50 are positioned or supported on the first supporting element 331, with the supporting element 331 in this embodiment as well having two frame strip elements 331*a*, 331*c* each with a support surface or a support region 331*b*, 331*d*. Here, the strips 331*a*, 331*c* are applied not on the floor element, but rather on side wall elements 24 of the process box. In addition, a (second) support element 36 is disposed on the floor element and additionally supports the multilayer bodies such that bending of the bodies can substantially be prevented. A plurality of these second support elements would be conceivable. It is also possible that the frame strip elements, i.e., the first supporting elements of the apparatus for positioning, are configured such that they form the side wall elements of the process box (readily discernible, e.g., in FIG. 6).

Figure 4:
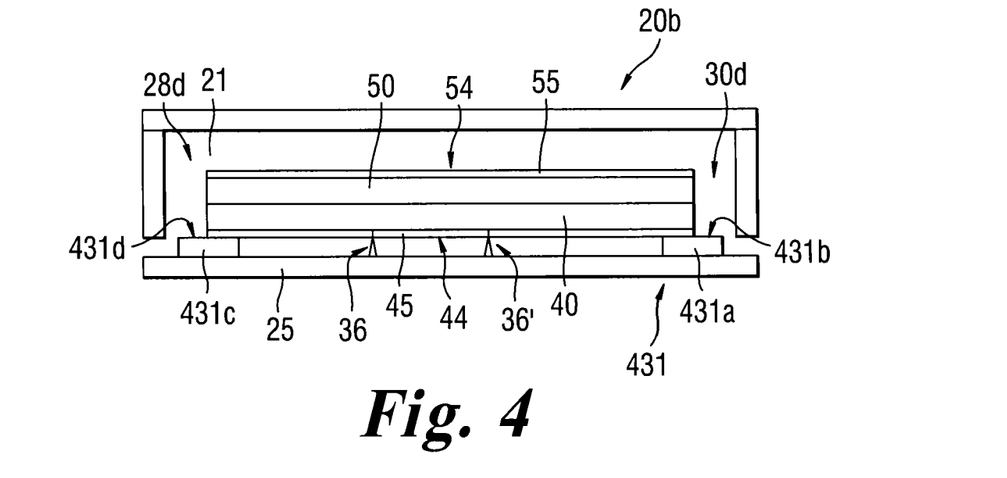
FIG. 4 another embodiment of the device according to the invention for forming a reduced chamber space.

FIG. 4 depicts a multilayer body arrangement 28*d* with an apparatus 30*d* for positioning the substrates 40, 50, wherein the arrangement is positioned under a process hood 20*b*. Here, the multilayer body arrangement 28*d* is disposed on a carrier 25 that introduces the multilayer body arrangement 28*d* by means of the transport apparatus (not shown) into the system for processing. Situated in the process chamber or in the process tunnel is the process hood 20*b*, which is then lowered onto the carrier with the multilayer body arrangement 28*d* in order to thus form the defined processing space 21. Here again, the apparatus 30*d* comprises a first supporting element 431 with two frame strip elements 431*a*, 431*c*, wherein the multilayer bodies 40, 50 rest on support regions 431*b*, 431*d* (edge regions 41). The support element is structured similar to that depicted in FIG. 1. The substrate 50 rests on the substrate 40, with the surfaces to be processed 44, 54 with the respective coatings 45, 55 facing away from each other. Here, the apparatus 30*d* further comprises two (second) support elements 36, 36' that are disposed on the carrier 25 and that additionally support the substrates 40, 50. The needle-shaped design of the support elements hardly shadows the surface to be processed such that it is substantially freely accessible for processing.

Figure 5:
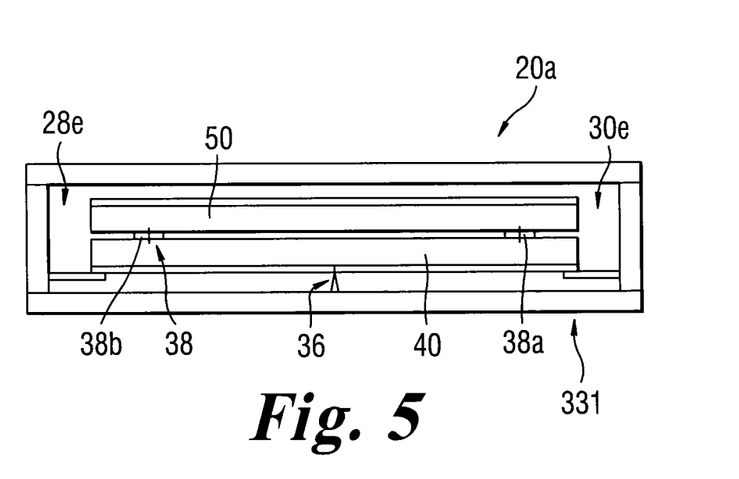
FIG. 5 another embodiment of the device according to the invention for forming a reduced chamber space.

FIG. 5 substantially depicts the arrangement of FIG. 3, with an apparatus 30*e* for positioning the multilayer bodies 40, 50, with which a multilayer body arrangement 28*e* is formed. The supporting element 331 corresponds to that of FIG. 3. In contrast to FIG. 3, here, the two substrates are positioned or placed with a spacing element 38. Here, the spacing element 38 comprises, for example, two strip elements 38*a*, 38*b* and is placed between the two substrates 40, 50 (on the surfaces not to be processed) such that the substrates are disposed at a distance from each other.

Figure 6:
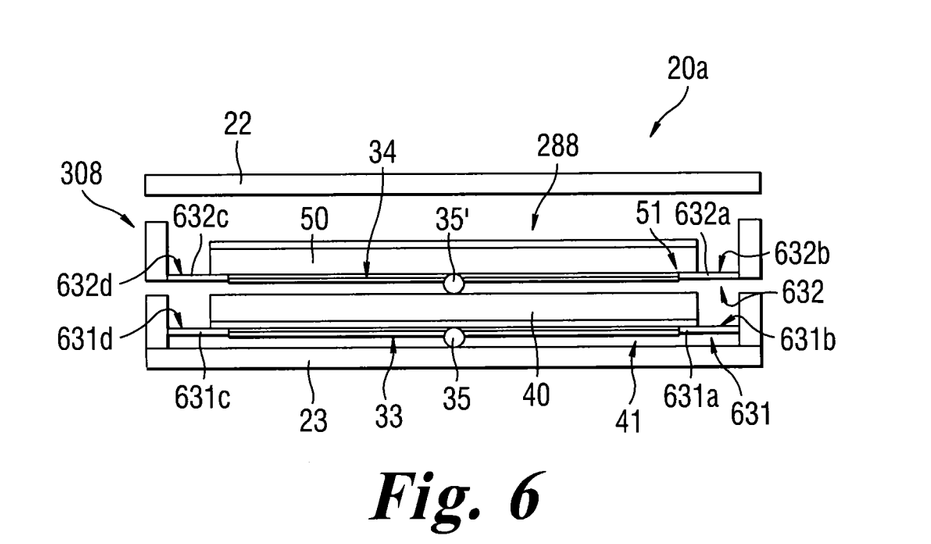
FIG. 6 another embodiment of the apparatus or arrangement according to invention in a device for forming a reduced chamber space.

FIG. 6 depicts, finally, another embodiment of the apparatus 30*f* according to the invention for positioning the two substrates 40, 50 that are arranged in a multilayer body arrangement 28*f*. Here, for the positioning of the two substrates 40, 50 in the process box 20*a*, a first supporting element 631 and a second supporting element 632 are provided. The first supporting element 631 again comprises two frame strip elements 631*a*, 631*c* each having a support region or a support surface 631*b*, 631*d*. The second supporting element 632 likewise comprises two frame strip elements 632*a*, 632*c* each having a support region or a support surface 632*b*, 632*d*. The substrates 40, 50 rest, in each case, with their edge regions 41, 51 on the respective support surfaces 631*b*, 631*d*, 632*b*, 632*d*. The two supporting elements 631, 632 are configured such that they can be stacked on each other such that the substrates 40, 50 again can be disposed or positioned sandwich-like. Here, the respective frame strip elements have an L-shaped cross-section and thus form the side wall elements of the process box 20*a*. It is, of course, also possible to provide side wall elements per se of the process box 20a and to attach the supporting elements thereon (e.g., removably such that the process box can also be used for other arrangements of substrates). With the individual positioning of the substrates, smaller forces act on the bottom substrate 40 such that any bending thereof is also less. In this embodiment, the supporting elements 631, 632 have, in each case, a cross-connection element 33 and 34, with a support element 35 or 35', respectively, disposed on both the "top" cross-connection element 34 and also on the "bottom" cross-connection element 33. The support element 35' of the second (top) supporting element 632 rests on the substrate back side of the bottom substrate (and, of course, supports the top substrate). The embodiment can be realized even without these cross-connection elements.

Figure 7:
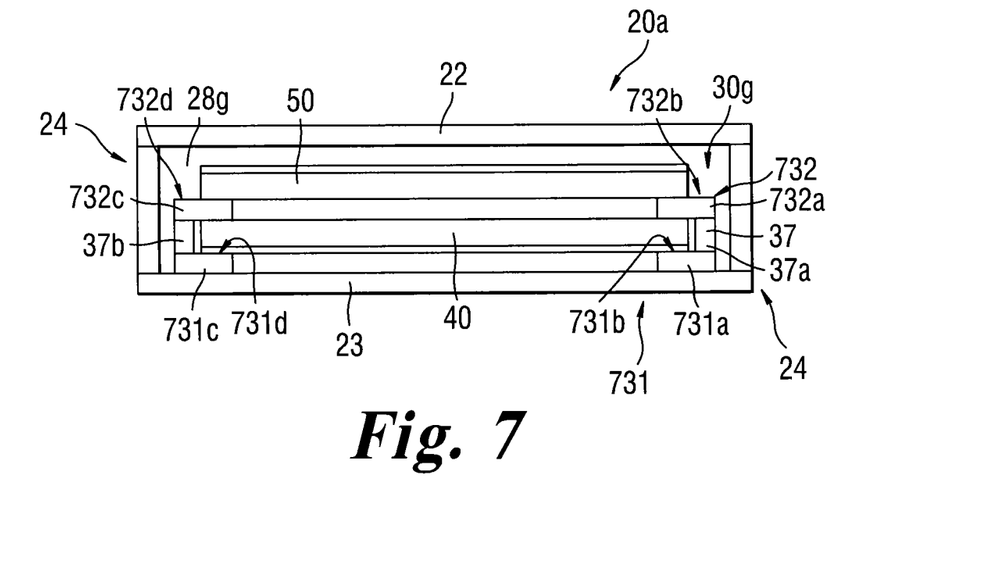
FIG. 7 another embodiment of the device according to the invention for forming a reduced chamber space.

FIG. 7 depicts a multilayer body arrangement 28g with an apparatus 30g for positioning the substrates 40, 50, wherein the arrangement is again positioned in the process box 20a. The apparatus 30g comprises a first supporting element 731 (with frame strip element 731a, support region 731b, frame strip element 731c, support region 731d), a second supporting element 732 (with frame strip element 732a, support region 732b, frame strip element 732c, support region 732d) and an intermediate element 37, optionally, also with strip elements 37a, 37b, which is disposed between the first supporting element 731 and the second supporting element 732 such that the three elements form, in cross-section, a substantially C-shaped arrangement. The first supporting element 731 rests on the floor element 23 of the process box 20a. Supporting element 731, supporting element 732, and intermediate element 37 can also be formed in one piece (at least the respective strip elements). The process box 20a has side wall elements 24 per se. With this arrangement as well, the bottom substrate 40 is unburdened and its possible bending is counteracted.

In the embodiments depicted, the supporting elements are designed as strip elements such that, in each case, opening areas 60 remain on the transverse sides of the arrangements for the gas exchange between the processing space and the chamber space (in particular for the precursor layer of the bottom multilayer body). It would also be possible to use closed frame elements and to provide at least one gas feed and evacuation element. This can, for example, be realized as a gas diffuser comb in the respective frame element and can be provided with docking rods (connection elements) for gas connection lines. This would, in particular, be important for the bottom multilayer body, since the top multilayer body or the top precursor layer is "free" anyway. Incidentally, the opening areas can also be provided on the longitudinal sides of the arrangement or the supporting elements are designed such that opening areas are provided on both the transverse sides and the longitudinal sides. In the case of square substrates, no distinction is made between longitudinal sides and transverse sides.

FIG. 8 depicts, finally, the system 10 already described above, into which the arrangements 28a, 28b, 28c, 28d, 28e, 28f and/or 28g with the apparatuses 30a, 30b, 30c, 30d, 30e, 30f and/or 30g for positioning (not shown here) can be introduced for processing with or without a device per se for forming a reduced chamber space.

The transport of the arrangement or of the apparatus (with or without a device for forming a reduced chamber space) into and out of the system occurs, for example, via a transport device (not shown), that operates with or without a support (i.e., for example, a carrier) for the substrates or occurs manually. The arrangement can also be assembled directly inside the processing system.

With the apparatus presented for positioning objects with a multilayer body arrangement formed therewith, with a multilayer body arrangement that is assembled without an apparatus for positioning, a system for processing the multilayer body arrangement, and with the corresponding method for forming the multilayer body arrangement, multilayer bodies, e.g. substrates, can be processed in a simple manner with high throughput (for example, for production of chalcopyrite semiconductors).

The Following Description Reveals Further Characteristics of the Invention:

The invention relates to an apparatus for positioning at least two objects, in particular, at least two multilayer bodies each having at least one surface to be processed, wherein the apparatus to accommodate the at least two objects, in particular, multilayer bodies, is configured such that the objects, in particular, multilayer bodies, are opposite each other, with the surfaces to be processed facing away from each other such that the at least two objects are processable, in particular selenizable, as a multilayer body arrangement in a processing system. According to one embodiment, the apparatus for positioning at least two objects is configured such that it can be disposed or is disposed in a processing chamber or a process tunnel of the processing system with a chamber space and/or in a device for forming a reduced chamber space, preferably in a process box with a floor element, a cover element, and, preferably, with side wall elements, or inside a process hood, which is configured, in particular, for stationary retention in the processing system, and/or on or against a carrying element for transporting the multilayer body arrangement by means of a transport apparatus into the processing system and out of it. According to one embodiment, the apparatus for positioning at least two objects is configured such that at least a part of the apparatus forms at least a part of the process box, in particular at least partially, the side wall elements of the process box. According to one embodiment, the apparatus for positioning at least two objects is configured such that the multilayer bodies are disposed sandwich-like on top of each other while in use and thus form a bottom multilayer body and a top multilayer body of the multilayer body arrangement. According to one embodiment, the apparatus for positioning at least two objects is configured such that the multilayer bodies with the surfaces to be processed facing away from each other can be positioned on top of each other. According to one embodiment, the apparatus for positioning at least two objects has at least one spacing element, wherein the spacing element can be disposed at least partially between the two multilayer bodies such that they can be positioned at a distance from each other. According to one embodiment, the apparatus for positioning at least two objects has at least a first supporting element that can be or is disposed on a chamber floor and/or on chamber side walls of the process chamber and/or on the floor element and/or on the side wall elements of the process box and/or on or against the carrying element for transport of the multilayer body arrangement by means of the transport apparatus into and out of the processing system, with the first supporting element configured such that the bottom multilayer body can be disposed, preferably at its edge regions, at least partially on the first supporting element, in particular, can rest on the supporting element. According to one embodiment, the apparatus for positioning at least two objects has at least a second supporting element that can be or is disposed on the chamber floor and/or on the chamber side walls of the process chamber and/or on the floor element and/or on the side wall elements of the process box and/or on or against the first supporting element and/or on or against the carrying element for transportation of the multilayer body arrangement by means of the transport apparatus into the processing system and out of it, with the second supporting element configured such that the top multilayer body can be disposed, preferably on its edge regions, at least partially against the second supporting element, in particular, can rest on the supporting element. According to one embodiment, on the one hand, the first supporting element and/or the second supporting element are provided, in each case, as a frame element, preferably as a rectangular or square frame element replicating the contours of the multilayer bodies such that the multilayer bodies can be disposed preferably on their edge regions at least partially on the respective frame element, in particular can rest on the frame element, and/or, on the other hand, the first supporting element and/or the second supporting element are each configured as two frame strip elements opposite each other in a plane of extension of the multilayer bodies while in use such that the multilayer bodies, preferably on their edge regions, preferably on their longitudinal sides, can be disposed at least partially on the frame strip elements, in particular, can rest on the frame strip elements. According to one embodiment, the apparatus for positioning at least two objects includes an intermediate element that can be disposed between the first supporting element and the second supporting element such that the second supporting element can be positioned on the first supporting element. According to one embodiment, the first supporting element and/or the second supporting element each have at least one cross-connection element to connect regions of the respective frame element opposite each other in the plane of extension of the multilayer bodies or of frame strip elements opposite each other while in use such that the multilayer body (bodies) can be additionally supported to prevent bending. According to one embodiment, the cross connection element has at least a first support element, preferably a point support element, particularly preferably a spherical element, such that the multilayer bodies can rest on or abut against the cross-connection element via the support element, with the support element configured such that it has the same height as the respective at least one frame element and/or the frame strip elements. According to one embodiment, the apparatus for positioning at least two objects has at least a second support element, preferably a point support element, particularly preferably a spherical element that is provided on the chamber floor of the process chamber and/or on the floor element of the process box to support the multilayer body arrangement. According to an embodiment, the respective frame element and/or frame strip element has at least two support elements such that the multilayer bodies can rest on or abut against the support elements.

The invention relates to a multilayer body arrangement, comprising at least two multilayer bodies, each having at least one surface to be processed, and at least an apparatus for positioning the at least two multilayer bodies, as is described above.

The invention relates to a multilayer body arrangement, comprising at least two multilayer bodies, each having at least one surface to be processed, wherein the at least two multilayer bodies are designed such that they are opposite each other, with the surfaces to be processed facing away from each other.

The invention relates to a system for processing, in particular for selenizing at least two objects, in particular at least two multilayer bodies, each having at least one surface to be processed, comprising at least a process chamber with a chamber space, and an apparatus for positioning the at least two objects, as is described above. Advantageously, the system has a gas feed element and/or a gas evacuation element to feed and/or evacuate a process gas into and/or out of the chamber space and/or the processing space.

The invention relates to a method for positioning at least two objects, in particular at least two multilayer bodies each having at least one surface to be processed, by means of an apparatus for positioning the at least two objects, in particular multilayer bodies, which is designed to accommodate the at least two objects, in particular the multilayer bodies, wherein the method comprises the following steps: Arranging the apparatus at a location provided therefor; arranging the two objects, in particular multilayer bodies, on the apparatus such that the objects, in particular multilayer bodies, are opposite each other, with the surfaces to be processed facing away from each other such that the at least two objects are processable as a multilayer body arrangement in a processing system, in particular selenizable.

The invention relates to a method for positioning at least two objects, in particular at least two multilayer bodies each having at least one surface to be processed, wherein the method comprises the following step: Arranging the two objects, in particular the two multilayer bodies, such that the objects, in particular the multilayer bodies, are opposite each other, with the surfaces to be processed facing away from each other such that the at least two objects are processable as a multilayer body arrangement in a processing system, in particular selenizable.

LIST OF REFERENCE CHARACTERS

10 System for processing
11 Process chamber, process tunnel
12 Chamber space
13 Entry door
14 Exit door
15 Chamber cover
16 Chamber floor
17 Chamber (side) wall or walls
18 Source(s) for electromagnetic radiation
20a Device for forming a reduced chamber space, process box
20b Device for forming a reduced chamber space, process hood
21 Processing space
22 Cover element
23 Floor element
24 Side wall element(s)
25 Carrying element, carrier
28a Arrangement, multilayer body arrangement
28b Arrangement, multilayer body arrangement
28c Arrangement, multilayer body arrangement
28d Arrangement, multilayer body arrangement
28e Arrangement, multilayer body arrangement
28f Arrangement, multilayer body arrangement
28g Arrangement, multilayer body arrangement
30a Apparatus for positioning
30b Apparatus for positioning
30c Apparatus for positioning
30d Apparatus for positioning
30e Apparatus for positioning
30f Apparatus for positioning
30g Apparatus for positioning
131 First supporting element
131a Frame strip element
131b Support region
131c Frame strip element
131d Support region
231 First supporting element 231a Frame strip element
231b Support region
231c Frame strip element
231d Support region
331 First supporting element
331a Frame strip element
331b Support region
331c Frame strip element
331d Support region
431 First supporting element
431a Frame strip element
431b Support region
431c Frame strip element
431d Support region
631 First supporting element
631a Frame strip element
631b Support region
631c Frame strip element
631d Support region
731 First supporting element
731a Frame strip element
731b Support region
731c Frame strip element
731d Support region
632 Second supporting element
632a Frame strip element
632b Support region
632c Frame strip element
632d Support region
732 Second supporting element
732a Frame strip element
732b Support region
732c Frame strip element
732d Support region
33 Cross-connection element
34 Cross-connection element
35 Support element
35' Support element
36 Support element
36' Support element
37 Intermediate element
37a Strip element of the intermediate element
37b Strip element of the intermediate element
38 Spacing element
38a Strip element of the spacing element
38b Strip element of the spacing element
40 Bottom multilayer body, substrate
41 Edge region(s)
44 Surface to be processed
45 (Precursor-) coating
50 Top multilayer body, substrate
51 Edge region(s)
54 Surface to be processed
55 (Precursor-) coating
60 Opening area arrangement
B Direction of movement entry door, exit door

The invention claimed is:

1. A device comprising an apparatus, which positions at least two multilayer bodies, each comprising a surface to be processed,
wherein the apparatus is designed such that the multilayer bodies are opposite each other, wherein the surfaces to be processed are facing away from each other and such that the multilayer bodies are processable as a multilayer body arrangement in a processing system,
wherein the apparatus is designed such that the multilayer bodies are sandwiched on top of each other while in use to form a bottom multilayer body and a top multilayer body of the multilayer body arrangement,
wherein the device is a process box, and the apparatus comprises a first supporting element disposed on a floor element and/or on a side wall element of the process box, wherein the first supporting element is designed such that the bottom multilayer body is at least partially supported on the first supporting element,
wherein the apparatus comprises a second supporting element disposed on the floor element and/or on the side wall element of the process box and/or on or against the first supporting element, wherein the second supporting element is designed such that the top multilayer body is at least partially supported on the second supporting element,
wherein, the first supporting element and/or the second supporting element are provided in each case as a frame element such that the multilayer bodies are disposed at least partially on the respective frame element and/or, the first supporting element and/or the second supporting element are designed in each case as two frame strip elements opposite to each other in a plane of extension of the multilayer bodies while in use such that the multilayer bodies are disposed at least partially on the frame strip elements,
wherein the first supporting element and/or the second supporting element each comprise a cross-connection element, which connects regions of the respective frame element opposite to each other in the plane of extension of the multilayer bodies or of frame strip elements opposite to each other while in use such that the multilayer bodies are supported and prevented from bending, and
wherein the cross-connection element comprises a first support element such that the multilayer bodies rest on or abut against the cross-connection element via the support element, wherein the support element has the same height as the frame element and/or frame strip elements.

2. The device of claim 1, wherein at least a part of the apparatus configured for positioning the at least two multilayer bodies forms at least a part of the device.

3. The device of claim 1, wherein the apparatus comprises an intermediate element disposed between the first supporting element and the second supporting element such that the second supporting element is stacked on the first supporting element.

4. The device of claim 1, wherein the apparatus comprises a second support element provided on a floor element of the process box to support the multilayer body arrangement.

5. The device of claim 1, wherein the frame element and/or frame strip element comprises at least two support elements such that the multilayer bodies can rest on or abut against the support elements.

6. The device of claim 1, wherein the apparatus comprises a spacing element disposed at least partially between the two multilayer bodies such that the multilayer bodies are positioned at a distance from each other.

* * * * *